US011387366B2

(12) United States Patent
Sharma et al.

(10) Patent No.: US 11,387,366 B2
(45) Date of Patent: Jul. 12, 2022

(54) ENCAPSULATION LAYERS OF THIN FILM TRANSISTORS

(71) Applicant: Intel Corporation, Santa Clara, CA (US)

(72) Inventors: Abhishek A. Sharma, Hillsboro, OR (US); Van H. Le, Beaverton, OR (US); Jack T. Kavalieros, Portland, OR (US); Tahir Ghani, Portland, OR (US); Gilbert Dewey, Hillsboro, OR (US); Shriram Shivaraman, Hillsboro, OR (US); Inanc Meric, Portland, OR (US); Benjamin Chu-Kung, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/634,517

(22) PCT Filed: Sep. 27, 2017

(86) PCT No.: PCT/US2017/053842
§ 371 (c)(1),
(2) Date: Jan. 27, 2020

(87) PCT Pub. No.: WO2019/066824
PCT Pub. Date: Apr. 4, 2019

(65) Prior Publication Data
US 2020/0343379 A1    Oct. 29, 2020

(51) Int. Cl.
*H01L 29/786* (2006.01)
*H01L 27/108* (2006.01)
(Continued)

(52) U.S. Cl.
CPC ...... *H01L 29/786* (2013.01); *H01L 27/10805* (2013.01); *H01L 27/2436* (2013.01); *H01L 29/518* (2013.01); *H01L 29/66765* (2013.01)

(58) Field of Classification Search
CPC .......................... H01L 29/4908; H01L 29/495; H01L 29/4958
See application file for complete search history.

(56) References Cited

U.S. PATENT DOCUMENTS 8,853,695 B2    10/2014   Hino et al.
2007/0023746 A1  2/2007   Birau et al.
(Continued)

FOREIGN PATENT DOCUMENTS

KR   10-2009-0068241   6/2009
WO   WO-2004-093198    10/2004

OTHER PUBLICATIONS

International Search Report and Written Opinion for International Patent Application No. PCT/US2017/053842 dated Jun. 27, 2018, 16 pgs.
(Continued)

*Primary Examiner* — Mohammed R Alam
(74) *Attorney, Agent, or Firm* — Schwabe, Williamson & Wyatt, P.C.

(57) ABSTRACT

Embodiments herein describe techniques for a semiconductor device, which may include a substrate, a metallic encapsulation layer above the substrate, and a gate electrode above the substrate and next to the metallic encapsulation layer. A channel layer may be above the metallic encapsulation layer and the gate electrode, where the channel layer may include a source area and a drain area. In addition, a source electrode may be coupled to the source area, and a drain electrode may be coupled to the drain area. Other embodiments may be described and/or claimed.

25 Claims, 7 Drawing Sheets

(51) Int. Cl.
*H01L 27/24* (2006.01)
*H01L 29/51* (2006.01)
*H01L 29/66* (2006.01)

(56) References Cited

U.S. PATENT DOCUMENTS

| | | | |
|---|---|---|---|
| 2011/0121298 A1* | 5/2011 | Ichiryu | H01L 29/458 257/57 |
| 2013/0134412 A1* | 5/2013 | Godo | H01L 29/4908 257/43 |
| 2015/0243508 A1 | 8/2015 | Romero et al. | |
| 2016/0035860 A1 | 2/2016 | Pillarisetty et al. | |
| 2017/0170211 A1* | 6/2017 | Yamazaki | H01L 29/4908 |

OTHER PUBLICATIONS

International Preliminary Report on Patentability for International Patent Application No. PCT/US2017/053842, dated Apr. 9, 2020, 11 pgs.

* cited by examiner

ENCAPSULATION LAYERS OF THIN FILM TRANSISTORS

CROSS-REFERENCE TO RELATED APPLICATION

This patent application is a U.S. National Phase Application under 35 U.S.C. § 371 of International Application No. PCT/US2017/053842, filed Sep. 27, 2017, entitled "ENCAPSULATION LAYERS OF THIN FILM TRANSISTORS," which designates the United States of America, the entire disclosure of which is hereby incorporated by reference in its entirety and for all purposes.

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays.

Sometimes, TFTs may not have good electrostatic gate control during backend processing steps, which may lead to a severely shifted threshold voltage. For example, high temperature deposition and anneal operations, particularly in presence of hydrogen or an ambient with insufficient oxygen, may cause poor subthreshold swing, poor ON/OFF ratio, or other performance degradations for TFTs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
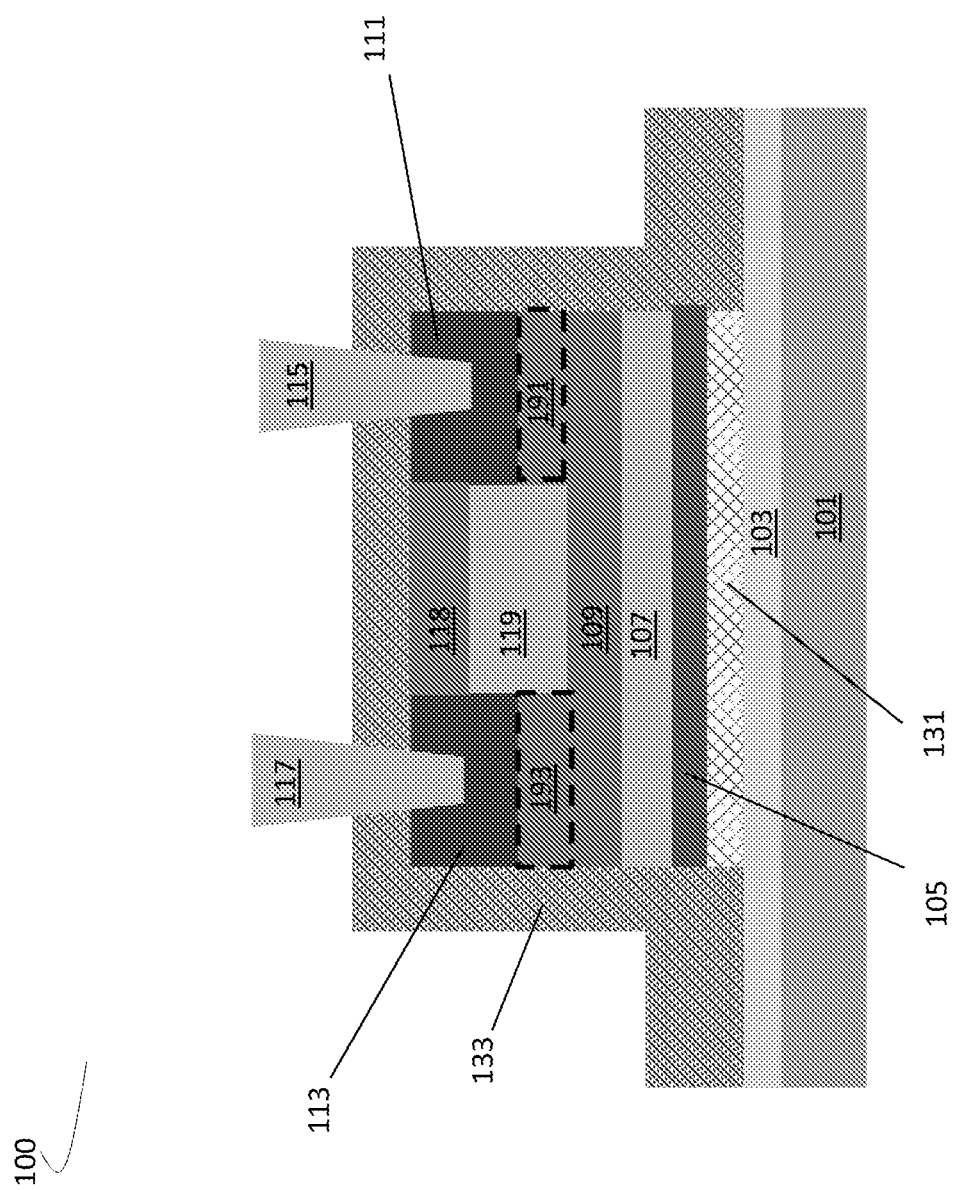
FIG. 1 schematically illustrates a diagram of a thin-film transistor (TFT) having a metallic encapsulation layer above a substrate and a gate electrode next to the metallic encapsulation layer, in accordance with some embodiments.

TFTs have many applications. For example, a TFT may be used a selector of a memory cell in a memory array, where a gate electrode of the TFT may be coupled to a word line of the memory array. Thin-film transistors (TFTs) may be fabricated through multiple operations, some of which may be high temperature deposition and anneal operations. During the operations, presence of hydrogen or an ambient with insufficient oxygen may cause poor performance issues for the TFTs, e.g., subthreshold swing, poor ON/OFF ratio, or other performance issues for TFTs. Embodiments herein may employ encapsulation layers to protect TFTs against subsequent process operations so that the TFTs may be protected from hydrogen or moisture exposure, or oxygen loss. Embodiments herein may include TFTs with improved subthreshold swing and better ON/OFF ratio.

In some embodiments, a metallic encapsulation layer may be used to protect the gate electrode from undesired performance degradation, while being coupled to a word line of a memory array. Accordingly, a metallic encapsulation layer may act in both functions as an encapsulation layer, and also as a part of interconnect for the memory array. Embodiments herein may also include an insulating encapsulation layer above the metallic encapsulation layer to offer further protection by conformally covering the metallic encapsulation layer, the gate electrode, the channel layer, the source electrode, and the drain electrode.

Embodiments herein may present a semiconductor device, which may include a substrate, a metallic encapsulation layer above the substrate, and a gate electrode above the substrate and next to the metallic encapsulation layer. A channel layer may be above the metallic encapsulation layer and the gate electrode, where the channel layer may include a source area and a drain area. In addition, a source electrode may be coupled to the source area, and a drain electrode may be coupled to the drain area.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell, where the storage cell may be coupled to a bit line of the memory array. The transistor in the memory cell may include a substrate, a metallic encapsulation layer above the substrate, where the metallic encapsulation layer may be a part of a word line for the memory array. A gate electrode may be above the substrate and next to the metallic encapsulation layer. A channel layer may be above the metallic encapsulation layer and the gate electrode, where the channel layer may include a source area and a drain area. In addition, a source electrode may be coupled to the source area, and a drain electrode may be coupled to the drain area.

In embodiments, a method for forming a semiconductor device may include: forming a metallic encapsulation layer above a substrate; forming a gate electrode above the substrate and next to the metallic encapsulation layer; forming a channel layer above the metallic encapsulation layer and the gate electrode, wherein the channel layer may include a source area and a drain area; and forming a source electrode coupled to the source area, and a drain electrode coupled to the drain area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a TFT 100 having a metallic encapsulation layer 131 above a substrate 101 and a gate electrode 105 next to the metallic encapsulation layer 131, in accordance with some embodiments. For clarity, features of the TFT 100, the metallic encapsulation layer 131, the substrate 101, and the gate electrode 105, may be described below as examples for understanding an example TFT, a metallic encapsulation layer, a substrate, and/or a gate electrode. It is to be understood that there may be more or fewer components within a TFT, a metallic encapsulation layer, a substrate, and/or a gate electrode. Further, it is to be understood that one or more of the components within a TFT, a metallic encapsulation layer, a substrate, and/or a gate electrode, may include additional and/or varying features from the description below, and may include any device that one having ordinary skill in the art would consider and/or refer to as a TFT, a metallic encapsulation layer, a substrate, and/or a gate electrode.

In embodiments, the TFT 100 may include the substrate 101, an ILD layer 103 above the substrate 101, and the metallic encapsulation layer 131 above the ILD layer 103 and the substrate 101. Hence, the ILD layer 103 may be above the substrate 101 and below the metallic encapsulation layer 131. The gate electrode 105 may be above the metallic encapsulation layer 131, and next to the metallic encapsulation layer 131. A gate dielectric layer 107 may be above the gate electrode 105. A channel layer 109 may be above the metallic encapsulation layer 131 and the gate electrode 105, and further above the gate dielectric layer 107. Hence, the gate dielectric layer 107 may be below the channel layer 109. The channel layer 109 may include a source area 191 and a drain area 193. A source electrode 111 may be coupled to the source area 191, and a drain electrode 113 may be coupled to the drain area 193. A spacer 119 may be next to the channel layer 109, the source area 191, the drain area 193, the source electrode 111, and the drain electrode 113. An additional dielectric layer 118 may be above the spacer 119.

The metallic encapsulation layer 131 may protect the gate electrode 105 that is next to the metallic encapsulation layer 131. In embodiments, the metallic encapsulation layer 131 may include one or more conductive films including a conductive material. For example, the metallic encapsulation layer 131 may include gold (Au), platinum (Pt), ruthenium (Ru), iridium (Ir), titanium (Ti), aluminum (Al), molybdenum (Mo), gold (Au), copper (Cu), tantalum (Ta), tungsten (W), nickel (Ni), chromium (Cr), or an alloy of Ti, Mo, Au, Pt, Al Ni, Cu, Cr, TiAlN, HfAlN, or InAlO.

Furthermore, an insulating encapsulation layer 133 may be above the metallic encapsulation layer 131, the gate electrode 105, the channel layer 109, the source electrode 111, and the drain electrode 113, to offer further protection. The insulating encapsulation layer 133 may conformally cover the metallic encapsulation layer 131, the gate electrode 105, the channel layer 109, the source electrode 111, and the drain electrode 113. A source contact 115 may go through the insulating encapsulation layer 133 and in contact with the source electrode 111. Similarly, a drain contact 117 may go through the insulating encapsulation layer 133 and in contact with the drain electrode 113. In embodiments, the insulating encapsulation layer 133 may include silicon, nitride, aluminum nitride, aluminum oxide, hafnium oxide, yttrium oxide, tantalum oxide, zirconium oxide, gallium oxide, gallium nitride, silicon oxide nitride, or other insulating encapsulation materials.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103, or the dielectric layer 118, may be optional. The ILD layer 103, or the dielectric layer 118 may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials.

In embodiments, the gate electrode 105, the source electrode 111, the drain electrode 113, the source contact 115, and the drain contact 117, may be formed as a single layer or a stacked layer using one or more conductive films including a conductive material. For example, the gate electrode 105, the source electrode 111, the drain electrode 113, the source contact 115, and the drain contact 117, may include gold (Au), platinum (Pt), ruthenium (Ru), iridium (Ir), titanium (Ti), aluminum (Al), molybdenum (Mo), gold (Au), copper (Cu), tantalum (Ta), tungsten (W), nickel (Ni), chromium (Cr), or an alloy of Ti, Mo, Au, Pt, Al Ni, Cu, Cr, TiAlN, HfAlN, or InAlO. For example, the gate electrode 105, the source electrode 111, the drain electrode 113, the source contact 115, and the drain contact 117, may include tantalum nitride (TaN), titanium nitride (TiN), iridium-tantalum alloy (Ir—Ta), indium-tin oxide (ITO), the like, and/or a combination thereof.

In embodiments, the gate dielectric layer 107 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 107 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

In embodiments, the channel layer 109 may include a material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC). The channel layer 109 may have a thickness in a range of about 10 nm to about 100 nm.

In embodiments, the spacer 119 may separate the source electrode 111 and the drain electrode 113. In embodiments, the spacer 119 may overlap with the gate electrode 105. The spacer 119 may include a dielectric material, similar to a dielectric material for the ILD layer 103, or the dielectric layer 118.

Figure 2:
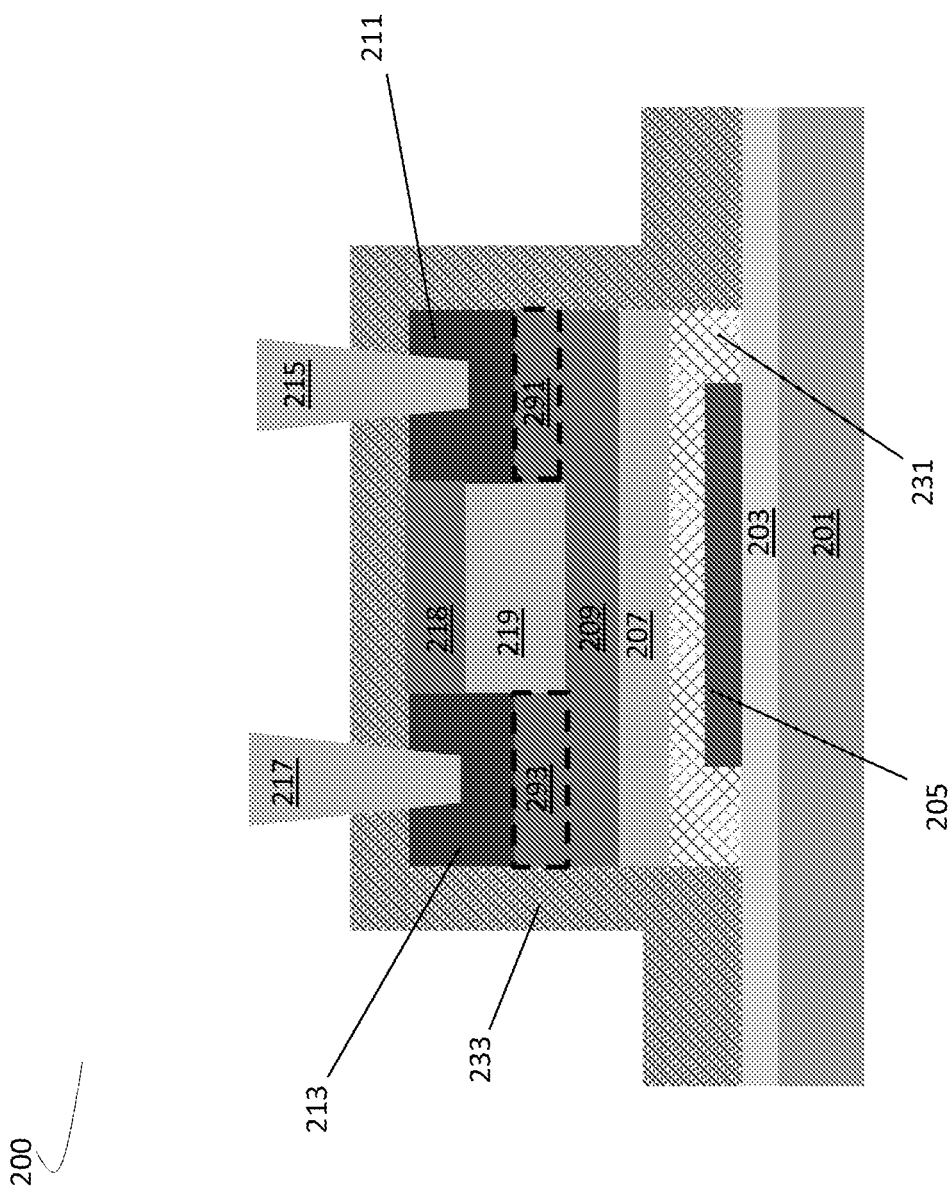
FIG. 2 schematically illustrates a diagram of another TFT having a metallic encapsulation layer above a substrate and a gate electrode next to the metallic encapsulation layer, in accordance with some embodiments.

FIG. 2 schematically illustrates a diagram of another TFT 200 having a metallic encapsulation layer 231 above a substrate 201 and a gate electrode 205 next to the metallic encapsulation layer 231, in accordance with some embodiments. In embodiments, the TFT 200 may be similar to the TFT 100, while the metallic encapsulation layer 231, the substrate 201, and the gate electrode 205 may be similar to the metallic encapsulation layer 131, the substrate 101, and the gate electrode 105, shown in FIG. 1. Various other layers in the TFT 200 may be similar to corresponding layers in the TFT 100 in FIG. 1. The structure of the TFT 200 may be for illustration purpose only and is not limiting.

In embodiments, the TFT 200 may include the substrate 201, an ILD layer 203 above the substrate 201, while the gate electrode 205 may be above the ILD layer 203. Different from the TFT 100 in FIG. 1, the metallic encapsulation layer 231 may be above the ILD layer 203 and the gate electrode 205, conformally covering the gate electrode 205. On the other hand, the metallic encapsulation layer 131 may be below the gate electrode 105 in FIG. 1. The metallic encapsulation layer 231 may protect the gate electrode 205 that is next to the metallic encapsulation layer 231.

In addition, a gate dielectric layer 207 may be above the metallic encapsulation layer 231. A channel layer 209 may be above the metallic encapsulation layer 231 and the gate electrode 205, and further above the gate dielectric layer 207. The channel layer 209 may include a source area 291 and a drain area 293. A source electrode 211 may be coupled to the source area 291, and a drain electrode 213 may be coupled to the drain area 293. A spacer 219 may be next to the channel layer 209, the source area 291, the drain area 293, the source electrode 211, and the drain electrode 213. An additional dielectric layer 218 may be above the spacer 219.

Furthermore, an insulating encapsulation layer 233 may be above the metallic encapsulation layer 231, the gate electrode 205, the channel layer 209, the source electrode 211, and the drain electrode 213, to offer further protection. The insulating encapsulation layer 233 may conformally cover the metallic encapsulation layer 231, the gate electrode 205, the channel layer 209, the source electrode 211, and the drain electrode 213. A source contact 215 may go through the insulating encapsulation layer 233 and in contact with the source electrode 211. Similarly, a drain contact 217 may go through the insulating encapsulation layer 233 and in contact with the drain electrode 213.

Figure 3:
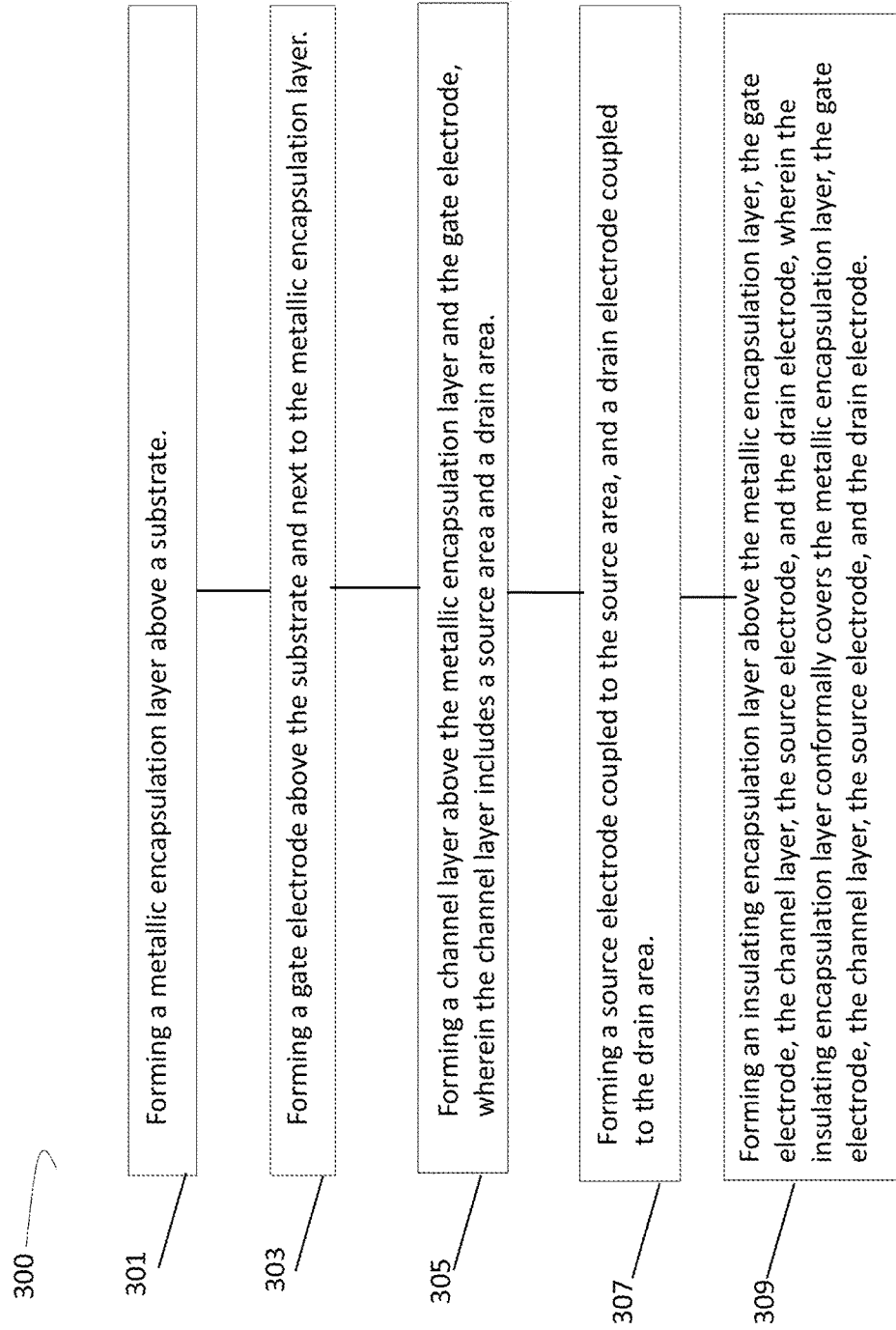
FIG. 3 illustrates a process for forming a TFT having a metallic encapsulation layer above a substrate and a gate electrode next to the metallic encapsulation layer, in accordance with some embodiments.

FIG. 3 illustrates a process 300 for forming a TFT having a metallic encapsulation layer above a substrate and a gate electrode next to the metallic encapsulation layer, in accordance with some embodiments. In embodiments, the process 300 may be applied to form the TFT 100 in FIG. 1, or the TFT 200 in FIG. 2.

At block 301, the process 300 may include forming a metallic encapsulation layer above a substrate. For example, the process 300 may include forming the metallic encapsulation layer 131 above the substrate 101 as shown in FIG. 1.

At block 303, the process 300 may include forming a gate electrode above the substrate and next to the metallic encapsulation layer. For example, the process 300 may include forming the gate electrode 105 above the substrate 101 and next to the metallic encapsulation layer 131. The gate electrode 105 may be above the metallic encapsulation layer 131. In some other embodiments, the process 300 may include forming the gate electrode 205 above the substrate 201, and further forming the metallic encapsulation layer 231 above the substrate 101 and above the gate electrode 205 as shown in FIG. 2.

At block 305, the process 300 may include forming a channel layer above the metallic encapsulation layer and the gate electrode, wherein the channel layer includes a source area and a drain area. For example, the process 300 may include forming the channel layer 109 above the metallic encapsulation layer 131 and the gate electrode 105, as shown in FIG. 1. The channel layer 109 may include the source area 191 and the drain area 193.

At block 307, the process 300 may include forming a source electrode coupled to the source area, and a drain electrode coupled to the drain area. For example, the process 300 may include forming the source electrode 111 coupled to the source area 191, and forming the drain electrode 113 coupled to the drain area 193.

At block 309, the process 300 may include forming an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode. For example, the process 300 may include forming the insulating encapsulation layer 133 above the metallic encapsulation layer 131, the gate electrode 105, the channel layer 109, the source electrode 111, and the drain electrode 113. The insulating encapsulation layer 133 may conformally covers the metallic encapsulation layer 131, the gate electrode 105, the channel layer 109, the source electrode 111, and the drain electrode 113.

In addition, the process 300 may include additional operations. For example, the process 300 may include forming a source contact through the insulating encapsulation layer and in contact with the source electrode; and forming a drain contact through the insulating encapsulation layer and in contact with the drain electrode. Furthermore, the process 300 may include forming a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Figure 4:
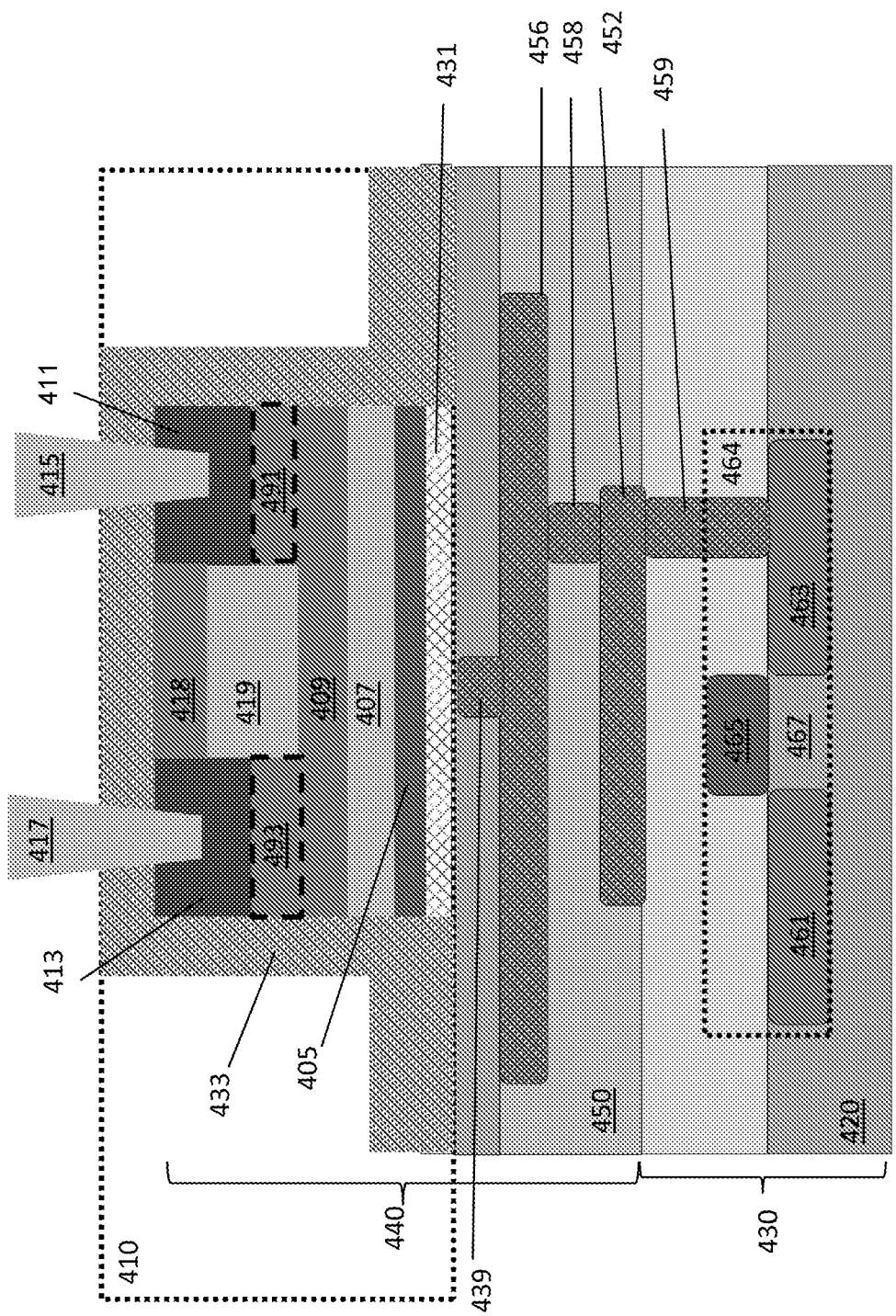
FIG. 4 schematically illustrates a diagram of a TFT having a metallic encapsulation layer and formed in back-end-of-line (BEOL) on a substrate, in accordance with some embodiments.

FIG. 4 schematically illustrates a diagram of a TFT 410 having a metallic encapsulation layer 431 and formed in back-end-of-line (BEOL) on a substrate 420, in accordance with some embodiments. The TFT 410 may be an example of the TFT 100 in FIG. 1, or an example of the TFT 200 in FIG. 2. Various layers in the TFT 410 may be similar to corresponding layers in the TFT 100 in FIG. 1, or the TFT 200 in FIG. 2. The structure of the TFT 410 may be for illustration purpose only and is not limiting.

In embodiments, the TFT 410 may be formed on the substrate 420. The TFT 410 may include a metallic encapsulation layer 431, and a gate electrode 405 next to the metallic encapsulation layer 431. The TFT 410 may include a gate dielectric layer 407 above the metallic encapsulation layer 431 and the gate electrode 405, a channel layer 409 above the metallic encapsulation layer 431 and the gate electrode 405, and further above the gate dielectric layer 407. The channel layer 409 may include a source area 491 and a drain area 493. A source electrode 411 may be coupled to the source area 491, and a drain electrode 413 may be coupled to the drain area 493. A spacer 419 may be next to the channel layer 409, the source area 491, the drain area 493, the source electrode 411, and the drain electrode 413. An additional dielectric layer 418 may be above the spacer 419.

Furthermore, an insulating encapsulation layer 433 may be above the metallic encapsulation layer 431, the gate electrode 405, the channel layer 409, the source electrode 411, and the drain electrode 413, to offer further protection. The insulating encapsulation layer 433 may conformally cover the metallic encapsulation layer 431, the gate electrode 405, the channel layer 409, the source electrode 411, and the drain electrode 413. A source contact 415 may go through the insulating encapsulation layer 433 and in contact with the source electrode 411. Similarly, a drain contact 417 may go through the insulating encapsulation layer 433 and in contact with the drain electrode 413.

In embodiments, the TFT 410 may be formed at the BEOL 440. In addition to the TFT 410, the BEOL 440 may further include a dielectric layer 450, where one or more vias, e.g., a via 458, may be connected to one or more interconnect, e.g., an interconnect 456, and an interconnect 452 within the dielectric layer 450. In addition, the interconnect 456 may be coupled to the metallic encapsulation layer 431 by a via 439. In embodiments, the interconnect 456 and the interconnect 452 may be of different metal layers at the BEOL 440. The dielectric layer 450 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 420. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 452, through a via 459.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Figure 5:
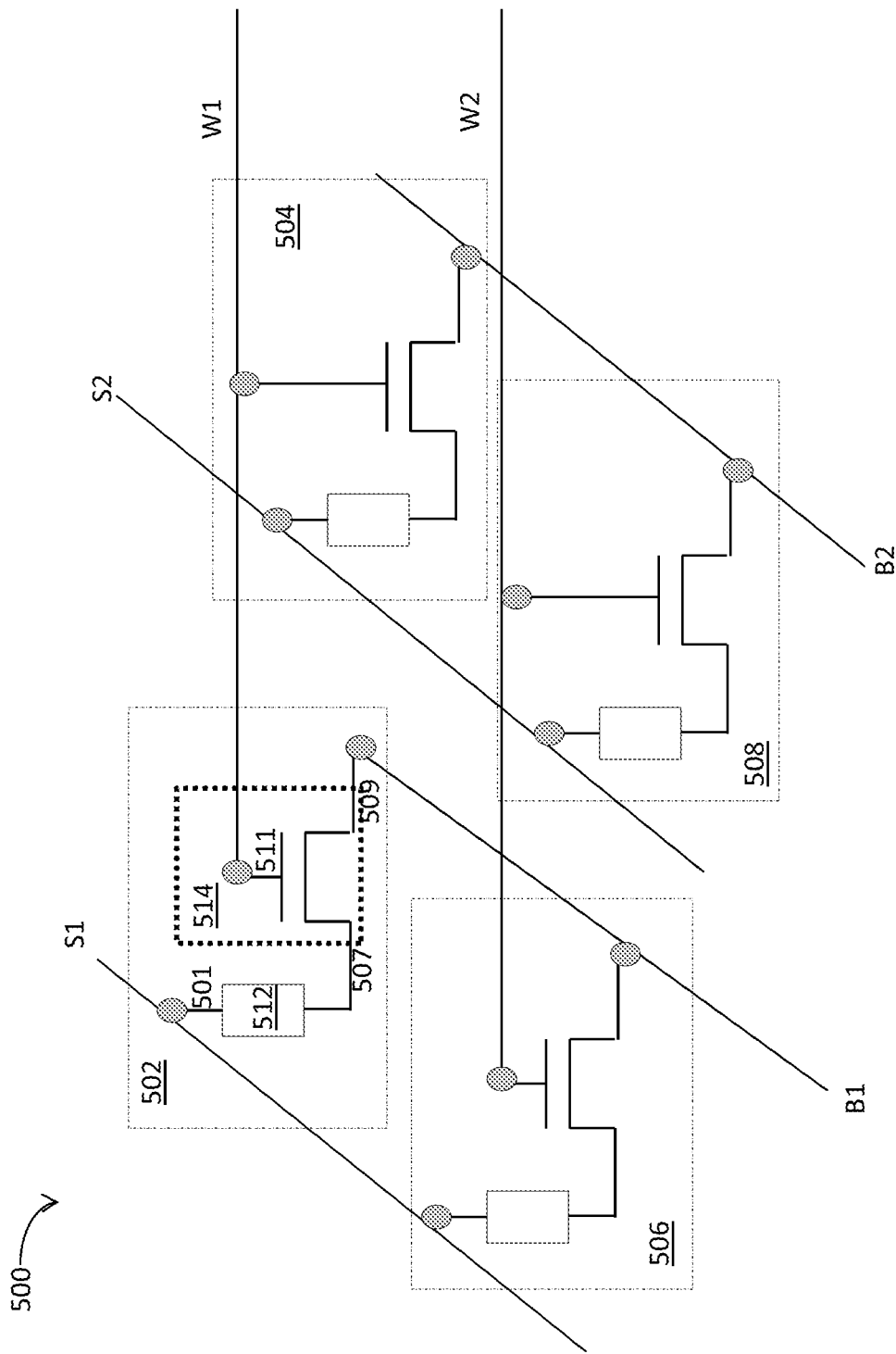
FIG. 5 schematically illustrates a memory array with multiple memory cells, where a TFT may be a selector of a memory cell, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the TFT 514 may be an example of the TFT 100 in FIG. 1, or an example of the TFT 200 in FIG. 2. The TFT 514 may include a gate electrode 511 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations. In some embodiments, the storage cell 512 may be another type of storage device, e.g., a resistive random access memory (RRAM) cell.

The TFT 514 may be a selector for the memory cell 502. A word line W1 of the memory array 500 may be coupled to a gate electrode 511 of the TFT 514. When the word line W1 is active, the TFT 514 may select the storage cell 512. A source line S1 of the memory array 500 may be coupled to an electrode 501 of the storage cell 512, while another electrode 507 of the storage cell 512 may be shared with the TFT 514. In addition, a bit line B1 of the memory array 500 may be coupled to another electrode, e.g., an electrode 509 of the TFT 514. The shared electrode 507 may be a source electrode or a drain electrode of the TFT 514, while the electrode 509 may be a drain electrode or a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the TFT 410 shown in FIG. 4 at the BEOL. Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
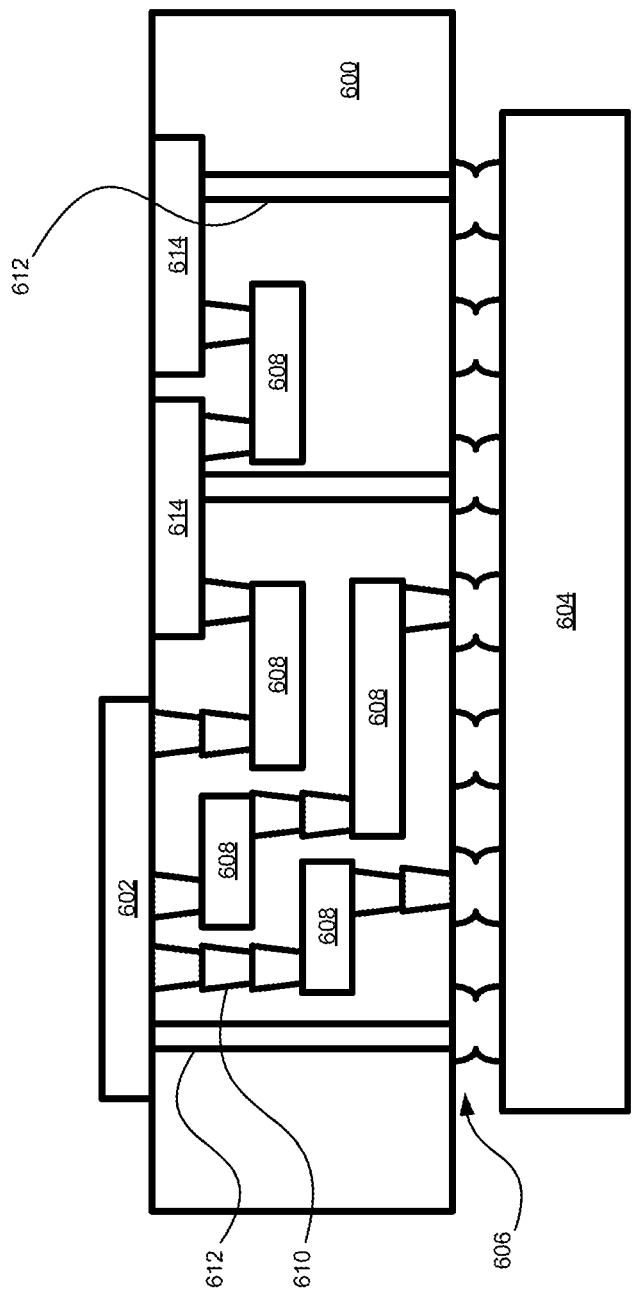
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a TFT, e.g., the TFT 100 shown in FIG. 1 or the TFT 200 shown in FIG. 2. The second substrate 604 may be, for instance, a memory module, a computer motherboard, or another integrated circuit die. For example, the second substrate 604 may be a memory module including the memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
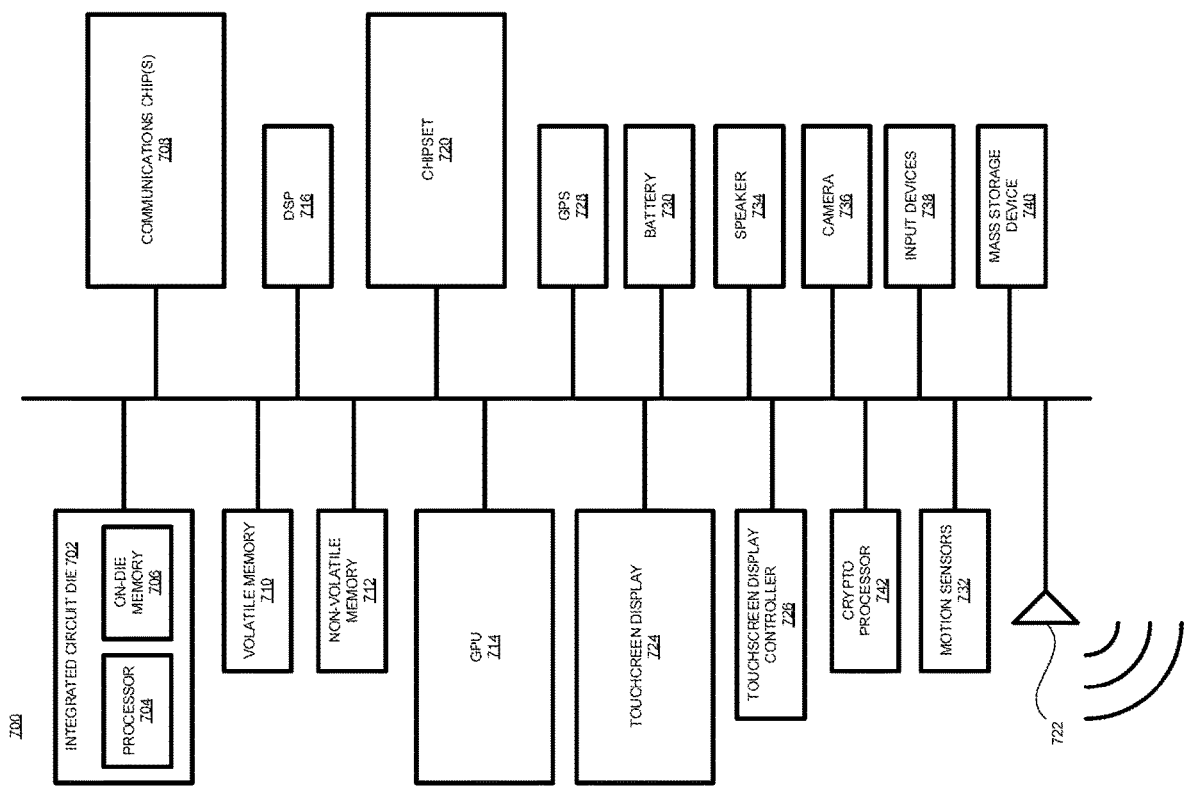
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the TFT 100 shown in FIG. 1, the TFT 200 shown in FIG. 2, the TFT 410 shown in FIG. 4, or a TFT formed according to the process 300 shown in FIG. 3.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others. For example, the touchscreen display 724 may include the TFT 100 shown in FIG. 1, the TFT 200 shown in FIG. 2, the TFT 410 shown in FIG. 4, or a TFT formed according to the process 300 shown in FIG. 3.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the TFT 100 shown in FIG. 1, the TFT 200 shown in FIG. 2, the TFT 410 shown in FIG. 4, or a TFT formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include a semiconductor device, comprising: a substrate; a metallic encapsulation layer above the substrate; a gate electrode above the substrate and next to the metallic encapsulation layer; a channel layer above the metallic encapsulation layer and the gate electrode, wherein the channel layer includes a source area and a drain area; and a source electrode coupled to the source area, and a drain electrode coupled to the drain area.

Example 2 may include the semiconductor device of example 1 and/or some other examples herein, further comprising: an interlayer dielectric (ILD) layer above the substrate and below the metallic encapsulation layer.

Example 3 may include the semiconductor device of example 1 and/or some other examples herein, wherein the metallic encapsulation layer is above the gate electrode and the substrate.

Example 4 may include the semiconductor device of example 1 and/or some other examples herein, further comprising: a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 5 may include the semiconductor device of any one of examples 1-4 and/or some other examples herein, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 6 may include the semiconductor device of any one of examples 1-4 and/or some other examples herein, wherein the metallic encapsulation layer is a part of a word line for a memory array.

Example 7 may include the semiconductor device of any one of examples 1-4 and/or some other examples herein, wherein the metallic encapsulation layer includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 8 may include the semiconductor device of any one of examples 1-4 and/or some other examples herein, wherein the substrate includes a silicon substrate, a glass substrate, a metal substrate, or a plastic substrate.

Example 9 may include the semiconductor device of any one of examples 1-4 and/or some other examples herein, further comprising: an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

Example 10 may include the semiconductor device of example 9 and/or some other examples herein, further comprising: a source contact through the insulating encapsulation layer and in contact with the source electrode; and a drain contact through the insulating encapsulation layer and in contact with the drain electrode.

Example 11 may include the semiconductor device of example 9 and/or some other examples herein, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

Example 12 may include a computing device comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a substrate; a metallic encapsulation layer above the substrate, wherein the metallic encapsulation layer is a part of a word line for the memory array; a gate electrode above the substrate and next to the metallic encapsulation layer; a channel layer above the metallic encapsulation layer and the gate electrode, wherein the channel layer includes a source area and a drain area; and a source electrode coupled to the source area, and a drain electrode coupled to the drain area; and the storage cell is coupled to a bit line of the memory array.

Example 13 may include the computing device of example 12 and/or some other examples herein, wherein the metallic encapsulation layer is above the gate electrode and the substrate.

Example 14 may include the computing device of example 12 and/or some other examples herein, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 15 may include the computing device of any one of examples 12-14 and/or some other examples herein, wherein the transistor further includes: an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

Example 16 may include the computing device of example 15 and/or some other examples herein, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

Example 17 may include the computing device of any one of examples 12-14 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 18 may include a method for forming a semiconductor device, the method comprising: forming a metallic encapsulation layer above a substrate; forming a gate electrode above the substrate and next to the metallic encapsulation layer; forming a channel layer above the metallic encapsulation layer and the gate electrode, wherein the channel layer includes a source area and a drain area; and forming a source electrode coupled to the source area, and a drain electrode coupled to the drain area.

Example 19 may include the method of example 18 and/or some other examples herein, further comprising: forming an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

Example 20 may include the method of example 19 and/or some other examples herein, further comprising: forming a source contact through the insulating encapsulation layer and in contact with the source electrode; and forming a drain contact through the insulating encapsulation layer and in contact with the drain electrode.

Example 21 may include the method of any one of examples 18-20 and/or some other examples herein, further comprising: forming a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 22 may include the method of any one of examples 18-20 and/or some other examples herein, wherein the metallic encapsulation layer is a part of a word line for a memory array.

Example 23 may include the method of any one of examples 18-20 and/or some other examples herein, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 24 may include the method of any one of examples 18-20 and/or some other examples herein, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

Example 25 may include the method of any one of examples 18-20 and/or some other examples herein, wherein the metallic encapsulation layer includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 26 may include one or more computer-readable media having instructions for a computer device to form a semiconductor device, upon execution of the instructions by one or more processors, to perform the method of any one of examples 18-25.

Example 27 may include an apparatus for forming a semiconductor device, comprising: means for forming a metallic encapsulation layer above a substrate; means for forming a gate electrode above the substrate and next to the metallic encapsulation layer; means for forming a channel layer above the metallic encapsulation layer and the gate electrode, wherein the channel layer includes a source area and a drain area; and means for forming a source electrode coupled to the source area, and a drain electrode coupled to the drain area.

Example 28 may include the apparatus of example 27 and/or some other examples herein, further comprising: means for forming an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

Example 29 may include the apparatus of example 28 and/or some other examples herein, further comprising: means for forming a source contact through the insulating encapsulation layer and in contact with the source electrode; and means for forming a drain contact through the insulating encapsulation layer and in contact with the drain electrode.

Example 30 may include the apparatus of any one of examples 27-29 and/or some other examples herein, further comprising: means for forming a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 31 may include the apparatus of any one of examples 27-29 and/or some other examples herein, wherein the metallic encapsulation layer is a part of a word line for a memory array.

Example 32 may include the apparatus of any one of examples 27-29 and/or some other examples herein, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 33 may include the apparatus of any one of examples 27-29 and/or some other examples herein, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

Example 34 may include the apparatus of any one of examples 27-29 and/or some other examples herein, wherein the metallic encapsulation layer includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate;
a metallic encapsulation layer above the substrate, the metallic encapsulation layer having a lateral width;
a gate electrode above the metallic encapsulation layer;
a channel layer above the gate electrode, wherein the channel layer includes a source area and a drain area, and wherein the channel layer has a lateral width the same as the lateral width of the metallic encapsulation layer; and
a source electrode coupled to the source area, and a drain electrode coupled to the drain area, wherein the metallic encapsulation layer extends laterally beneath the source electrode and the drain electrode.

2. The semiconductor device of claim 1, further comprising:
an interlayer dielectric (ILD) layer above the substrate and below the metallic encapsulation layer.

3. The semiconductor device of claim 1, wherein the metallic encapsulation layer is above the gate electrode and the substrate.

4. The semiconductor device of claim 1, further comprising:
a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

5. The semiconductor device of claim 1, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

6. The semiconductor device of claim 1, wherein the metallic encapsulation layer is a part of a word line for a memory array.

7. The semiconductor device of any claim 1, wherein the metallic encapsulation layer includes titanium (Ti), molybdenum (Mo), gold (Au), platinum (Pt), aluminum (Al), nickel (Ni), copper (Cu), chromium (Cr), or an alloy of Ti, Mo, Au, Pt, Al, Ni, Cu, Cr, TiAlN, HfAlN, or InAlO.

8. The semiconductor device of claim 1, wherein the substrate includes a silicon substrate, a glass substrate, a metal substrate, or a plastic substrate.

9. The semiconductor device of claim 1, further comprising: an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

10. The semiconductor device of claim 9, further comprising:
a source contact through the insulating encapsulation layer and in contact with the source electrode; and
a drain contact through the insulating encapsulation layer and in contact with the drain electrode.

11. The semiconductor device of claim 9, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

12. A computing device comprising:
a circuit board; and
a memory device coupled to the circuit board and including a memory array, wherein the memory array includes a plurality of memory cells, a memory cell of the plurality of memory cells includes a transistor and a storage cell, and wherein the transistor includes:
a substrate;
a metallic encapsulation layer above the substrate, wherein the metallic encapsulation layer is a part of a word line for the memory array, and wherein the metallic encapsulation layer has a lateral width;
a gate electrode above the metallic encapsulation layer;
a channel layer above the gate electrode, wherein the channel layer includes a source area and a drain area, and wherein the channel layer has a lateral width the same as the lateral width of the metallic encapsulation layer; and
a source electrode coupled to the source area, and a drain electrode coupled to the drain area, wherein the metallic encapsulation layer extends laterally beneath the source electrode and the drain electrode; and
the storage cell is coupled to a bit line of the memory array.

13. The computing device of claim 12, wherein the metallic encapsulation layer is above the gate electrode and the substrate.

14. The computing device of claim 12, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), Ga7nON, ZnON, or C-Axis Aligned Crystal (CAAC).

15. The computing device of claim 12, wherein the transistor further includes: an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

16. The computing device of claim 15, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

17. The computing device of claim 12, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

18. A method for forming a semiconductor device, the method comprising:
forming a metallic encapsulation layer above a substrate, the metallic encapsulation layer having a lateral width;
forming a gate electrode above the metallic encapsulation layer;
forming a channel layer above the gate electrode, wherein the channel layer includes a source area and a drain area, and wherein the channel layer has a lateral width the same as the lateral width of the metallic encapsulation layer; and
forming a source electrode coupled to the source area, and a drain electrode coupled to the drain area, wherein the metallic encapsulation layer extends laterally beneath the source electrode and the drain electrode.

19. The method of claim 18, further comprising:
forming an insulating encapsulation layer above the metallic encapsulation layer, the gate electrode, the channel layer, the source electrode, and the drain electrode, wherein the insulating encapsulation layer conformally covers the metallic encapsulation layer, the gate electrode, the channel layer, the source electrode, and the drain electrode.

20. The method of claim 19, further comprising:
forming a source contact through the insulating encapsulation layer and in contact with the source electrode; and
forming a drain contact through the insulating encapsulation layer and in contact with the drain electrode.

21. The method of claim 18, further comprising:
forming a gate dielectric layer above the gate electrode and below the channel layer, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

22. The method of claim 18, wherein the metallic encapsulation layer is a part of a word line for a memory array.

23. The method of claim 18, wherein the channel layer includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

24. The method of claim 19, wherein the insulating encapsulation layer includes silicon, nitride, aluminum nitride, aluminum oxide, hafnium oxide, yttrium oxide, tantalum oxide, zirconium oxide, gallium oxide, gallium nitride, or silicon oxide nitride.

25. The method of claim 18, wherein the metallic encapsulation layer includes titanium (Ti), molybdenum (Mo), gold (Au), platinum (Pt), aluminum (Al), nickel (Ni), copper (Cu), chromium (Cr), or an alloy of Ti, Mo, Au, Pt, Al, Ni, Cu, Cr, TiAlN, HfAlN, or InAlO.

* * * * *